(12) United States Patent
Göötz et al.

(10) Patent No.: US 11,316,077 B2
(45) Date of Patent: Apr. 26, 2022

(54) RADIATION-EMITTING DEVICE

(71) Applicant: OSRAM Opto Semiconductors GmbH, Regensburg (DE)

(72) Inventors: Britta Göötz, Regensburg (DE); Norwin von Malm, Nittendorf (DE)

(73) Assignee: OSRAM OLED GmbH, Regensburg (DE)

( * ) Notice: Subject to any disclaimer, the term of this patent is extended or adjusted under 35 U.S.C. 154(b) by 71 days.

(21) Appl. No.: 16/480,732

(22) PCT Filed: Jan. 25, 2018

(86) PCT No.: PCT/EP2018/051867
§ 371 (c)(1),
(2) Date: Jul. 25, 2019

(87) PCT Pub. No.: WO2018/138213
PCT Pub. Date: Aug. 2, 2018

(65) Prior Publication Data
US 2019/0386182 A1    Dec. 19, 2019

(30) Foreign Application Priority Data
Jan. 30, 2017   (DE) .................... 10 2017 101 729.1

(51) Int. Cl.
*H01L 33/50*   (2010.01)
*H01L 33/60*   (2010.01)
(Continued)

(52) U.S. Cl.
CPC ............ *H01L 33/502* (2013.01); *H01L 33/50* (2013.01); *H01L 33/60* (2013.01);
(Continued)

(58) Field of Classification Search
CPC ....... H01L 51/50; H01L 51/5012–5016; H01L 51/502; H01L 51/5024; H01L 51/504;
(Continued)

(56) References Cited

U.S. PATENT DOCUMENTS 7,355,284 B2 * 4/2008 Negley ................... H01L 33/58
257/778
7,923,741 B1 * 4/2011 Zhai ........................ H01L 33/54
257/98
(Continued)

FOREIGN PATENT DOCUMENTS

DE    10 2005 061 828 A1    1/2007
DE    10 2008 012 407 A1    8/2009
(Continued)

OTHER PUBLICATIONS

Young Chul Shin et al., "Effects of Nanometer-Scale Photonic Crystal Structures on the Light Extraction From GaN Light-Emitting Diodes," IEEE Journal of Quantum Electronics, vol. 46, No. 9, Sep. 2010, pp. 1375-1380.
(Continued)

*Primary Examiner* — Maliheh Malek
(74) *Attorney, Agent, or Firm* — DLA Piper LLP (US)

(57) ABSTRACT

A radiation-emitting device includes a semiconductor layer sequence having an active layer that emits a primary radiation during operation, a decoupling surface on a surface of the semiconductor layer sequence, a wavelength conversion layer on a side of the semiconductor layer sequence facing away from the decoupling surface, containing at least one conversion material that converts the primary radiation into secondary radiation, and a mirror layer on the side of the wavelength conversion layer facing away from the semiconductor layer sequence, wherein the at least one conver-
(Continued)

sion material is electrically conductive and/or embedded in an electrically conductive matrix material.

19 Claims, 3 Drawing Sheets

(51) Int. Cl.
    *H01L 51/52*     (2006.01)
    *H01L 51/50*     (2006.01)
    *H01L 33/10*     (2010.01)

(52) U.S. Cl.
    CPC .......... *H01L 51/5262* (2013.01); *H01L 33/10* (2013.01); *H01L 51/502* (2013.01); *H01L 51/5271* (2013.01); *H01L 2933/0091* (2013.01)

(58) Field of Classification Search
    CPC ............. H01L 51/5237; H01L 51/5259; H01L 51/5262; H01L 51/5268; H01L 51/5271; H01L 33/50–504; H01L 33/10; H01L 33/405; H01L 33/46; H01L 33/52; H01L 33/54; H01L 33/56; H01L 2933/0041; H01L 2933/005; H01L 2924/1204–12042; H01S 5/00; H01S 5/005; H01S 5/0071; H01S 5/0078; H01S 5/0092; H01S 5/0609; H01S 5/0611; F21K 9/64; F21K 9/68; F21K 9/69

See application file for complete search history.

(56) References Cited

U.S. PATENT DOCUMENTS

| | | | | |
|---|---|---|---|---|
| 8,033,706 | B1* | 10/2011 | Kelly | G02F 1/133606 |
| | | | | 362/607 |
| 8,093,610 | B2 | 1/2012 | Wilm | H01L 33/50 |
| | | | | 257/98 |
| 8,328,375 | B2 | 12/2012 | Diekmann | F21V 33/0012 |
| | | | | 362/84 |
| 8,598,604 | B2 | 12/2013 | Eisert | H01L 33/50 |
| | | | | 257/89 |
| 8,637,883 | B2 | 1/2014 | Chakraborty | H01L 33/44 |
| | | | | 257/98 |
| 8,962,361 | B2 | 2/2015 | Petersen | H01L 33/50 |
| | | | | 438/29 |
| 8,965,148 | B2 | 2/2015 | Illek | G02B 6/0073 |
| | | | | 385/14 |
| 9,076,933 | B2* | 7/2015 | Liepold | C09K 11/7774 |
| 9,082,944 | B2 | 7/2015 | Wirth | H01L 33/56 |
| 9,150,784 | B1* | 10/2015 | Stoll | C09K 11/7792 |
| 9,324,919 | B2 | 4/2016 | Lee | H01L 33/60 |
| 9,324,920 | B2 | 4/2016 | Sabathil | H01L 33/48 |
| 9,634,191 | B2 | 4/2017 | Keller | H01L 33/62 |
| 9,709,225 | B2 | 7/2017 | Stoll | H01L 33/58 |
| 9,741,910 | B1 | 8/2017 | Haiberger | H01L 33/56 |
| 9,842,972 | B2 | 12/2017 | Bergenek | H01L 33/025 |
| 9,909,722 | B2 | 3/2018 | Inoue | F21V 9/38 |
| 9,945,989 | B2 | 4/2018 | Setz | H01L 51/56 |
| 10,190,046 | B2* | 1/2019 | Romer | C09K 11/7728 |
| 10,230,024 | B2 | 3/2019 | O'Brien | H01L 33/505 |
| 10,418,530 | B2 | 9/2019 | Windisch | H01L 33/505 |
| 10,421,904 | B2 | 9/2019 | Fitzmorris | H01L 33/507 |
| 10,472,735 | B2 | 11/2019 | Kelso | C30B 1/02 |
| 10,475,967 | B2 | 11/2019 | Anc | H01L 33/502 |
| 10,475,968 | B1 | 11/2019 | Zheng | C09K 11/02 |
| 10,483,439 | B2 | 11/2019 | Halbritter | H01L 33/58 |
| 10,522,718 | B2 | 12/2019 | Tangring | H01L 33/56 |
| 10,590,339 | B2 | 3/2020 | Piquette | B32B 27/283 |
| 10,597,512 | B2 | 3/2020 | Hohn | H01L 31/024 |
| 10,662,310 | B2 | 5/2020 | Tchoul | H01L 33/502 |
| 10,718,491 | B1 | 7/2020 | Raring | H01S 5/02284 |
| 10,840,403 | B2* | 11/2020 | Kurtin | C09K 11/02 |
| 10,847,684 | B2* | 11/2020 | Frischeisen | C03C 14/00 |
| 11,011,683 | B2* | 5/2021 | O'Brien | H01L 33/44 |
| 11,069,844 | B2* | 7/2021 | Haiberger | H01L 33/60 |
| 2002/0153835 | A1* | 10/2002 | Fujiwara | H01L 33/60 |
| | | | | 313/512 |
| 2005/0274967 | A1* | 12/2005 | Martin | C09K 11/02 |
| | | | | 257/98 |
| 2006/0124951 | A1* | 6/2006 | Sakata | C04B 35/653 |
| | | | | 257/99 |
| 2007/0080361 | A1* | 4/2007 | Malm | H01L 33/42 |
| | | | | 257/99 |
| 2007/0284567 | A1* | 12/2007 | Pokrovskiy | H01L 51/5293 |
| | | | | 257/13 |
| 2007/0285000 | A1* | 12/2007 | Lim | H01L 33/20 |
| | | | | 313/501 |
| 2008/0121918 | A1* | 5/2008 | DenBaars | H01L 33/54 |
| | | | | 257/98 |
| 2008/0123339 | A1* | 5/2008 | Bierhuizen | F21K 9/60 |
| | | | | 362/293 |
| 2008/0128727 | A1* | 6/2008 | Erchak | H01L 33/44 |
| | | | | 257/98 |
| 2008/0149166 | A1* | 6/2008 | Beeson | H01L 31/052 |
| | | | | 136/248 |
| 2008/0315228 | A1* | 12/2008 | Krames | H01L 33/46 |
| | | | | 257/98 |
| 2009/0039272 | A1* | 2/2009 | Krummacher | H01L 51/5036 |
| | | | | 250/370.01 |
| 2009/0050919 | A1* | 2/2009 | Weijers | H01L 33/504 |
| | | | | 257/98 |
| 2009/0050925 | A1* | 2/2009 | Kuramoto | H01L 33/26 |
| | | | | 257/100 |
| 2009/0057698 | A1* | 3/2009 | Okamura | H01L 33/502 |
| | | | | 257/98 |
| 2009/0086508 | A1* | 4/2009 | Bierhuizen | G02B 6/0021 |
| | | | | 362/617 |
| 2009/0091258 | A1* | 4/2009 | Heuser | H01L 51/5256 |
| | | | | 313/512 |
| 2009/0121250 | A1* | 5/2009 | DenBaars | H01L 33/54 |
| | | | | 257/98 |
| 2009/0272996 | A1* | 11/2009 | Chakraborty | H01L 33/56 |
| | | | | 257/98 |
| 2010/0038669 | A1* | 2/2010 | McKenzie | H01L 33/405 |
| | | | | 257/98 |
| 2010/0258831 | A1* | 10/2010 | Jagt | H01L 33/46 |
| | | | | 257/98 |
| 2010/0264438 | A1* | 10/2010 | Suenaga | H01L 33/58 |
| | | | | 257/98 |
| 2010/0308346 | A1* | 12/2010 | Cheng | G02B 6/009 |
| | | | | 257/88 |
| 2011/0006329 | A1* | 1/2011 | Fujita | C03B 19/06 |
| | | | | 257/98 |
| 2011/0090703 | A1* | 4/2011 | Ishimori | C04B 35/44 |
| | | | | 362/311.02 |
| 2011/0133628 | A1* | 6/2011 | Klein | H01L 51/5036 |
| | | | | 313/483 |
| 2011/0234118 | A1* | 9/2011 | Kim | H01L 33/502 |
| | | | | 315/291 |
| 2011/0248623 | A1* | 10/2011 | Ichikawa | F21K 9/00 |
| | | | | 313/483 |
| 2011/0284494 | A1* | 11/2011 | Von Malm | H01L 51/5036 |
| | | | | 216/13 |
| 2012/0032211 | A1* | 2/2012 | Schindler | H01L 51/5265 |
| | | | | 257/98 |
| 2012/0120649 | A1* | 5/2012 | Catalano | F21K 9/61 |
| | | | | 362/231 |
| 2012/0170303 | A1* | 7/2012 | Meir | G02B 6/0041 |
| | | | | 362/555 |
| 2013/0011617 | A1* | 1/2013 | Tasaki | H01L 31/022425 |
| | | | | 428/148 |
| 2013/0051421 | A1* | 2/2013 | Traut | H01S 5/0282 |
| | | | | 372/49.01 |
| 2013/0154478 | A1* | 6/2013 | Ohe | H05B 33/10 |
| | | | | 315/85 |
| 2013/0322114 | A1* | 12/2013 | Nishitani | G02B 6/0018 |
| | | | | 362/606 |
| 2013/0341634 | A1* | 12/2013 | Heikman | H01L 33/46 |
| | | | | 257/76 |

(56) References Cited

U.S. PATENT DOCUMENTS

| | | | | |
|---|---|---|---|---|
| 2014/0016754 | A1* | 1/2014 | Sugiyama | G01T 1/2002 378/62 |
| 2014/0042467 | A1* | 2/2014 | Livesay | H01L 33/642 257/88 |
| 2014/0070243 | A1* | 3/2014 | Kim | H01L 27/156 257/89 |
| 2014/0168571 | A1* | 6/2014 | Hyun | G02B 6/0085 349/61 |
| 2015/0003042 | A1* | 1/2015 | Strau | F21V 7/05 362/84 |
| 2015/0028365 | A1* | 1/2015 | Kurtin | C09K 11/025 257/88 |
| 2015/0123156 | A1* | 5/2015 | Eberhardt | H01L 33/483 257/98 |
| 2015/0167906 | A1* | 6/2015 | Tomiyama | F21V 9/30 353/31 |
| 2015/0221623 | A1* | 8/2015 | Tischler | H01L 33/58 257/89 |
| 2015/0252963 | A1* | 9/2015 | Stoll | F21V 13/02 362/293 |
| 2015/0357790 | A1* | 12/2015 | Jeoung | F21V 9/30 372/32 |
| 2016/0056347 | A1* | 2/2016 | Kubat | H01L 33/0075 257/76 |
| 2016/0064621 | A1* | 3/2016 | Yoneda | H01L 33/0093 438/27 |
| 2016/0087167 | A1* | 3/2016 | Kundaliya | H01L 33/505 428/162 |
| 2016/0170120 | A1* | 6/2016 | Shani | G02F 1/133614 362/607 |
| 2016/0172533 | A1* | 6/2016 | Song | H01L 33/0095 438/31 |
| 2016/0195244 | A1* | 7/2016 | Harada | F21S 41/675 362/84 |
| 2016/0197248 | A1* | 7/2016 | Ishizaki | C09K 11/7734 257/98 |
| 2016/0201880 | A1* | 7/2016 | Park | F21S 41/33 362/84 |
| 2016/0218254 | A1* | 7/2016 | Jacobson | H01L 25/0753 |
| 2017/0005245 | A1* | 1/2017 | Hsu | H01L 33/62 |
| 2017/0012179 | A1* | 1/2017 | von Malm | H01L 51/5262 |
| 2017/0117444 | A1* | 4/2017 | Stoll | H01L 33/502 |
| 2017/0125644 | A1* | 5/2017 | Tsuchiya | H01L 33/62 |
| 2017/0125648 | A1* | 5/2017 | Cui | H01L 33/502 |
| 2017/0133561 | A1* | 5/2017 | von Malm | H01L 33/54 |
| 2017/0162747 | A1* | 6/2017 | Aoyagi | H01L 33/46 |
| 2018/0031922 | A1* | 2/2018 | Kamada | G02F 1/133605 |
| 2018/0033920 | A1* | 2/2018 | Steltenpol | H01L 33/54 |
| 2018/0039006 | A1* | 2/2018 | Gotou | G02B 6/005 |
| 2018/0045395 | A1* | 2/2018 | Kamada | G02F 1/133606 |
| 2018/0046031 | A1* | 2/2018 | Kamada | G02B 6/0033 |
| 2018/0182934 | A1* | 6/2018 | Lin-Lefebvre | H01L 33/507 |
| 2019/0081219 | A1* | 3/2019 | Chen | H01L 33/505 |
| 2019/0097095 | A1* | 3/2019 | Yamanaka | H01S 5/02252 |
| 2019/0172983 | A1* | 6/2019 | Schricker | H01L 33/508 |
| 2019/0198738 | A1* | 6/2019 | Nakabayashi | H01L 33/60 |
| 2019/0219248 | A1* | 7/2019 | Patent | F21V 29/70 |
| 2019/0252581 | A1* | 8/2019 | Iwakura | H01L 33/60 |
| 2019/0373700 | A1* | 12/2019 | Meir | H05B 45/20 |
| 2020/0006602 | A1* | 1/2020 | O'Brien | H01L 33/44 |
| 2020/0028047 | A1* | 1/2020 | Su | H01L 33/502 |
| 2020/0044126 | A1* | 2/2020 | Tangring | H01L 33/486 |
| 2020/0058831 | A1* | 2/2020 | Dirscherl | C09K 11/0883 |
| 2020/0152822 | A1* | 5/2020 | Dirscherl | H01L 33/005 |
| 2020/0158937 | A1* | 5/2020 | Chang | G02B 6/005 |
| 2020/0271282 | A1* | 8/2020 | Aketa | G02B 5/0242 |
| 2021/0050489 | A1* | 2/2021 | Lim | H01L 33/504 |
| 2021/0083152 | A1* | 3/2021 | Biebersdorf | H01L 33/60 |

FOREIGN PATENT DOCUMENTS

| | | |
|---|---|---|
| DE | 10 2009 051 748 A1 | 5/2011 |
| EP | 2 339 656 A2 | 6/2011 |
| WO | 2009/095007 A1 | 8/2009 |
| WO | 2014/108289 A1 | 7/2014 |

OTHER PUBLICATIONS

Erich Kinder et al., "Fabrication of All-Inorganic Nanocrystal Solids through Matrix Encapsulation of Nanocrystal Arrays," Journal of the American Chemical Society, vol. 133, 2011, pp. 20488-20499.

* cited by examiner

RADIATION-EMITTING DEVICE

TECHNICAL FIELD

This disclosure relates to a radiation-emitting device.

BACKGROUND

There is a need to provide a radiation-emitting device with improved characteristics.

SUMMARY

We provide a radiation-emitting device including a semiconductor layer sequence having an active layer that emits a primary radiation during operation, a decoupling surface on a surface of the semiconductor layer sequence, a wavelength conversion layer on a side of the semiconductor layer sequence facing away from the decoupling surface, containing at least one conversion material that converts the primary radiation into secondary radiation, and a mirror layer on the side of the wavelength conversion layer facing away from the semiconductor layer sequence, wherein the at least one conversion material is electrically conductive and/or embedded in an electrically conductive matrix material.

We also provide a radiation-emitting device including a semiconductor layer sequence having an active layer that emits a primary radiation during operation, a decoupling surface on a surface of the semiconductor layer sequence, a wavelength conversion layer on a side of the semiconductor layer sequence facing away from the decoupling surface, containing at least one conversion material that converts the primary radiation into secondary radiation, a mirror layer on the side of the wavelength conversion layer facing away from the semiconductor layer sequence, wherein the at least one conversion material is electrically conductive and/or embedded in an electrically conductive matrix material, and the wavelength conversion layer has a roughened surface on the side facing away from the semiconductor layer sequence.

LIST OF REFERENCE SIGNS 10 semiconductor layer sequence
11 decoupling surface
20 active layer
30 wavelength conversion layer
40 mirror layer
50 encapsulation
60 current expansion layer
70 dielectric mirror layer
80 absorbent layer
90 planarization layer

DETAILED DESCRIPTION

We provide a radiation-emitting device comprising a semiconductor layer sequence with an active layer emitting primary radiation during operation.

The radiation-emitting device may be a semiconductor chip, in particular a light emitting diode chip. The term "active layer" means a layer of the semiconductor layer sequence, in particular an epitaxial semiconductor layer sequence, suitable and intended to generate and emit electromagnetic radiation during operation of the radiation-emitting device.

"Radiation," "electromagnetic radiation" and "light" mean electromagnetic radiation with at least one wavelength or spectral component in an infrared to ultraviolet wavelength range. For example, the primary radiation can have an ultraviolet to green wavelength range, in particular a blue wavelength range.

The radiation-emitting device may have a decoupling surface, hereinafter also referred to as the radiation decoupling surface, on a surface of the semiconductor layer sequence. The primary radiation generated by the active layer can be radiated with a ratio of at least 50% in the direction of the decoupling surface located on the surface of the semiconductor layer sequence.

The radiation-emitting device may comprise a wavelength conversion layer on the side of the semiconductor layer sequence facing away from the decoupling surface containing at least one conversion material converting the primary radiation into secondary radiation. For example, the secondary radiation may have a green to red wavelength range. The wavelength conversion layer may also contain several conversion materials, some of which generate secondary radiation in the green wavelength range and other secondary radiation in the red wavelength range. The wavelength conversion layer can be formed plane-parallel.

Due to the different optical densities of the semiconductor layer sequence and the ambient air at the radiation decoupling surface, a large part of the primary radiation at the decoupling surface can be reflected back into the radiation-emitting device so that up to 90% of the primary radiation can be converted into secondary radiation by the at least one conversion material in the wavelength conversion layer.

The wavelength conversion layer does not or hardly enlarge the device, for example, the semiconductor chip or the package. CSP (Chip-Size Package) components can thus also be made possible.

The radiation-emitting device may comprise a mirror layer on the side of the wavelength conversion layer facing away from the semiconductor layer sequence. The secondary radiation generated by the conversion material can be reflected by the mirror layer and also decoupled by the decoupling surface of the radiation-emitting device. Accordingly, a mixed light of unconverted primary and converted secondary radiation is emitted at the decoupling surface of the semiconductor layer sequence. This may allow the radiation-emitting device to emit mixed white light.

The term "on" with respect to the layer sequence in the radiation-emitting device means that, for example, the decoupling surface may be in direct contact with the semiconductor layer sequence or additional layers may be present between the decoupling surface and the semiconductor layer sequence. "Direct contact" means a mechanical, but also an electrical contact. Electrical contacting can also take place via an indirect mechanical contact.

The at least one conversion material may be electrically conductive and/or embedded in an electrically conductive matrix material. This means that the wavelength conversion layer contains either an electrically conductive conversion material or an electrically conductive conversion material embedded in a non-electrically conductive matrix material, an electrically conductive conversion material embedded in an electrically conductive matrix material, or a non-electrically conductive conversion material embedded in an electrically conductive matrix material. This maintains the power supply for operation of the radiation-emitting device. Additional current expansion or distribution layers can thus be dispensed with.

The radiation-emitting device may have a semiconductor layer sequence with an active layer that emits primary radiation during operation, a decoupling surface on a surface of the semiconductor layer sequence, a wavelength conversion layer on the side of the semiconductor layer sequence facing away from the decoupling surface, that contains at least one conversion material converting the primary radiation into secondary radiation, and a mirror layer on the side of the wavelength conversion layer facing away from the semiconductor layer sequence, wherein the at least one conversion material is electrically conductive and/or is embedded in an electrically conductive matrix material.

In the radiation-emitting device described here, the conversion material in the wavelength conversion layer is not subordinated to the decoupling surface of the radiation-emitting device compared to known radiation-emitting devices with wavelength conversion layers. Rather, the conversion material is integrated into the wavelength conversion layer of the radiation-emitting device so that the decoupling surface is free of conversion material. This means that the conversion material is arranged close to the chip and can also be applied at a wafer level. The conversion material is thus integrated into the chip process. The conversion is thus extremely close to the pump source or the heat sink and can therefore be cooled better than on the side of the semiconductor layer sequence on which the decoupling surface is present. This means that temperature-sensitive conversion materials can also be used at high current densities.

Because the wavelength conversion layer contains either an electrically conductive conversion material and/or an electrically conductive matrix material, it enables the semiconductor layer sequence to be electrically contacted. The electrically conductive wavelength conversion layer can be in direct or indirect electrical contact with the semiconductor layer sequence. In indirect electrical contact, for example, there may be an additional current expansion layer between the semiconductor layer sequence and the wavelength conversion layer. However, such a layer can also be dispensed with due to the electrically conductive example of the wavelength conversion layer.

The wavelength conversion layer can mediate the injection of electrons or holes into the semiconductor layer sequence on the side of the active layer facing away from the decoupling surface. By a further electrical contact, for example, an electrode, oppositely charged charge carriers, holes or electrons can be injected into the semiconductor layer sequence on the side of the active layer facing the radiation decoupling surface. The charge carriers injected into the semiconductor layer sequence from both sides of the active layer can recombine in the active layer while emitting light.

The electrically conductive matrix material may be selected from a group comprising doped and undoped metal oxides, doped and undoped metal halides, electrically conductive polymers, polymers charged with electrically conductive particles, and polymers charged with electrically conductive salts. Electrically conductive polymers are polymers based on conjugated systems, for example, fluorenes or spirofluorenes. Conductive particles with which polymers are charged can be silver particles, for example. Doped or undoped metal oxides may include doped or undoped ITO (indium tin oxide). Such matrix materials are light and temperature stable as well as transparent. Furthermore, they can be structured and thus well processed and applied at a wafer level. By using an electrically conductive matrix, a current expansion layer, for example, an ITO layer commonly used for current distribution, can be omitted.

The refractive index of the electrically conductive matrix material can be variable. This means that the refractive index can be adjusted to the degree of conversion of the wavelength conversion layer. For example, with a polymer matrix material the side chain lengths or the side chains can be changed. For example, $CH_3$ groups can be replaced by benzene groups to increase the refractive index. Furthermore, nanoparticles can be inserted into the matrix material to influence the refractive index of the matrix material. For example, $SiO_2$ particles can produce a slight increase in the refractive index, ZrO particles a stronger increase in the refractive index. If the matrix material has a higher refractive index, this can also be lowered with nanoparticles. Thus, the refractive index of the matrix can be used to adjust the color of the light emitted by the device.

The wavelength conversion layer may have a thickness of ≤30 μm, especially of ≤10 μm, preferably of ≤2 μm. For example, the wavelength conversion layer may contain a matrix material in which the at least one conversion material is embedded and have a thickness of about 10 μm. If the wavelength conversion layer does not contain a matrix material, its thickness can be about 1 μm, for example. The thickness of the wavelength conversion layer can also be used to adjust the refractive index of the wavelength conversion layer to the degree of conversion.

The at least one conversion material may be nanodisperse. Furthermore, the at least one conversion material can be non-scattering. If the conversion material is not electrically conductive, its nanoscale size allows the use of sufficient electrically conductive matrix material for sufficient current transport.

The at least one conversion material in the wavelength conversion layer may have a concentration of ≤100 mol %. Furthermore, the at least one conversion material in the wavelength conversion layer may have a concentration of ≥0.01 mol %. This means that the wavelength conversion layer may consist of or contain at least one conversion material. If the wavelength conversion layer consists of at least one conversion material, is the at least one conversion material electrically conductive. If, in addition to the conversion material, matrix material is also present in the wavelength conversion layer, either the conversion material or the matrix material or both can be electrically conductive. The concentration of at least one conversion material in the wavelength conversion layer can, for example, be 0.08 mol %. This can, for example, produce a bluish color location.

The conversion material may be selected from a group comprising quantum dots, quantum dots enclosed in an inorganic matrix, organometallic frameworks (MOFs, metal organic frameworks) and organometallic complexes, in particular Ir based metal organic complexes. Especially, if the wavelength conversion layer does not contain a matrix material, electrically conductive quantum dots can be used as conversion material. Electrically conductive quantum dots enclosed in an inorganic matrix may include, for example, CdSe in a ZnS shell or InGaP in a ZnS shell. Organometallic complexes with or without matrix material can be used well in the wavelength conversion layer as an electrically conductive conversion material. For example, organometallic complexes can be selected that are also used in organic light-emitting diodes. These can be, for example, fluorescent or phosphorescent dyes.

Such conversion materials are particularly light and temperature stable if they are embedded in a suitable matrix material and/or the wavelength conversion layer is encapsulated. The conversion materials can be selected to emit red and/or green light or a mixture thereof as secondary radiation. Furthermore, the conversion materials can be evaporated in a vacuum or applied dissolved in polymer matrix materials.

The wavelength conversion layer may have an absorbing material that absorbs wavelengths in the blue spectral range. This allows absorption of primary radiation in the wavelength conversion layer to be increased by transferring excitation of the absorbing material to the conversion material. An absorbent material may also be chemically bonded to a conversion material. For example, polymers with a blue absorbing backbone or an absorption in the UV range as well as red and/or green emitting side groups can be used. The excitons are generated in the backbone, the emission can then be adjusted to the desired color by the number of side groups. Such polymers can be electrically and optically excited.

The wavelength conversion layer may have a roughened surface on the side facing away from the semiconductor layer sequence. A roughened surface means a structured surface. Between the roughened surface and the mirror layer there can be a planarization layer. With a roughening of the wavelength conversion layer the decoupling can be improved. An additional roughening of the semiconductor layer sequence on the side of the decoupling surface can thus be dispensed with. The advantage of placing the improved decoupling on the side of the wavelength conversion layer facing away from the decoupling surface is that more blue light is directed to the conversion material. The decoupled, unconverted radiation is reflected back at the mirror layer and traverses the wavelength conversion layer once more. This allows the degree of conversion to be increased.

Furthermore, the radiation-emitting device can have an encapsulation surrounding at least the wavelength conversion layer and the mirror layer. The encapsulation can be applied after the mirror layer has been applied and, if necessary, encapsulate the semiconductor layer sequence, the wafer and the wavelength conversion layer. This means that sensitive conversion materials can also be used in the wavelength conversion layer that would otherwise not be usable at all or only with complex secondary encapsulation.

The encapsulation can comprise metallic or dielectric material. For example, the encapsulation can contain or consist of $Al_2O_3$ or $SiO_2$.

The encapsulation can have a thickness of less than or equal to 1 μm. In particular, the thickness can be 50 to 500 nm. Such encapsulation can, for example, be applied from the gas phase (by ALD or CVD). Application from the solution is also possible. This allows the wavelength conversion layer and the mirror layer to be encapsulated at wafer level.

Furthermore, the mirror layer can include a metal layer. This can be a silver layer, for example. The mirror layer can be an electrical contact layer. Alternatively, an electrical contact layer can be arranged on the mirror layer in addition to the mirror layer.

The mirror layer can be suitable for reflecting the primary radiation and the secondary radiation in the direction of the decoupling surface. This means that both converted electromagnetic radiation in the form of secondary radiation and non-converted electromagnetic radiation in the form of primary radiation can pass through the wavelength conversion layer and be reflected by the mirror layer. This allows electromagnetic primary radiation incident on the mirror layer to be reflected back into the wavelength conversion layer, thus increasing the conversion probability of the portion of primary radiation that can pass through the wavelength conversion layer in the direction of the mirror layer without conversion. On the other hand, the mirror layer enables the reflection of already converted secondary radiation, which is radiated away from the decoupling surface by the conversion material.

Further advantages and developments of the radiation-emitting device result from examples explained below and in connection with the figures.

In the examples and figures, identical or identical seemingly components are each provided with the same reference signs. The represented components as well as the proportions of the components among each other are not to be regarded as true to scale. Rather, some details of the figures are exaggeratedly large for better understanding.

Figure 1:
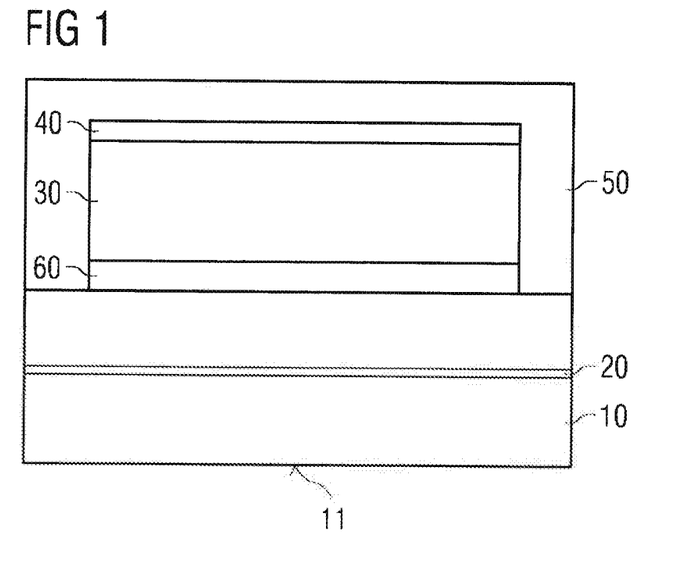
FIG. 1 shows a schematic cross-section of a radiation-emitting device according to an example.

FIG. 1 shows a schematic cross-section of a radiation-emitting device according to an example. Shown is the semiconductor layer sequence 10, within which an active layer 20 is arranged. The semiconductor layer sequence 10 has a layer stack with n- and p-conducting layers in addition to the active layer 20. For example, the semiconductor layer sequence 10 may be semiconductor layers based on nitride compound semiconductors such as GaN. The active layer 20 is located between the n- and p-conducting layers of the epitaxial semiconductor layer sequence 10 and emits primary radiation during operation of the radiation-emitting device comprising a blue wavelength range and produces a blue luminous impression.

The active layer 20 may comprise a conventional pn junction, a double heterostructure or a multiple double heterostructure, a single quantum well structure (SQW structure) or a multiple quantum well structure (MQW structure). The term quantum well structure covers within the application in particular any structure in which charge carriers can experience a quantization of their energy states by inclusion. In particular, the term quantum well structure contains no information about the dimensionality of the quantization. It includes thus quantum troughs, quantum wires and quantum dots and any combination of these structures.

The semiconductor layer sequence 10 can include further functional layers and functional regions in addition to the active layer 20 such as p- or n-doped charge carrier transport layers, i.e., electron or hole transport layers, undoped or p- or n-doped intermediate layers, buffer layers or protective layers.

The semiconductor layer sequence 10 can in particular be a thin-film LED chip.

The primary radiation can be decoupled by a decoupling surface 11 on a surface of the epitaxial semiconductor layer sequence 10.

A wavelength conversion layer 30 is arranged on the side of the semiconductor layer sequence 10 facing away from the decoupling surface 11. In this example, a current expansion layer 60 is arranged between the wavelength conversion layer 30 and the semiconductor layer sequence 10. The current expansion layer 60, for example, comprises or consists of ITO. The wavelength conversion layer 30 comprises a conversion material contained in the wavelength conversion layer with up to 100 mol %. If the wavelength conversion layer 30 consists of at least one conversion material only, the at least one conversion material is electrically conductive. This is, for example, quantum dots, quantum dots embedded in inorganic matrix materials such as CdSe in ZnS or InGaP in ZnS, organometallic frameworks or organic fluorescent or phosphorescent dyes. The conversion material is selected to emit secondary radiation in the red and green wavelength ranges. Furthermore, the conversion material is nanodisperse and non-scattering.

The wavelength conversion layer 30 can alternatively contain a matrix material in addition to the at least one conversion material. Possible combinations are electrically conductive conversion material and non-electrically conductive matrix material, electrically conductive conversion material and electrically conductive matrix material or non-electrically conductive conversion material and electrically conductive matrix material. As electrically conductive matrix material, conductive polymers based on conjugated systems, in particular fluorenes or spirofluorenes, polymers charged with conductive particles or salts, as well as metal oxides or metal halides that can each be doped, can be used. Such matrix materials are easy to structure and can therefore be used and processed for further chip processes. The refractive index of the wavelength conversion layer can be adjusted to the desired color of the secondary radiation by accordingly selecting the appropriate wavelength conversion layer thickness and the matrix material. In polymers, for example, the matrix material can be selected by suitable side chains so that the desired refractive index can be set.

The primary radiation emitted by the semiconductor layer sequence that is either decoupled in the direction of the wavelength conversion layer or reflected back at the decoupling surface 11 and thus reaches the wavelength conversion layer 30, is at least partially converted in the wavelength conversion layer. This achieves a high degree of conversion of the primary radiation into secondary radiation.

On the wavelength conversion layer also the mirror layer 40 is arranged that, for example, contains or consists of silver. The secondary radiation as well as unconverted primary radiation can be reflected at the mirror layer 40, if necessary converted in the wavelength conversion layer and decoupled from the device via the decoupling surface 11. For an external observer, this creates a mixed-color luminous impression of primary and secondary radiation.

The mirror layer 40 also serves to electrically contact the semiconductor layer sequence 10. Alternatively, a contact layer can still be present on the mirror layer (not shown). Also not shown is a further electrode opposite the mirror layer or a further contact layer that contacts the semiconductor layer sequence 10. Charge carriers, i.e., electrons and holes can be emitted via the mirror layer or further contact layer and the further electrode into the semiconductor layer sequence 10 and thus into the active layer 20, where they can recombine to generate the primary radiation.

FIG. 1 also shows an encapsulation 50 surrounding the wavelength conversion layer 30, the mirror layer 40 and the current expansion layer 60. The encapsulation also allows the use of sensitive conversion materials, which otherwise would not be usable or only with complex secondary encapsulation. The encapsulation can be metallic or dielectric. For example, the encapsulation contains $Al_2O_3$ or $SiO_2$. For example, it is a glass encapsulation with a thickness of about 50 nm. Due to the presence of the encapsulation 50, in particular the conversion materials are protected in the wavelength conversion layer 30 and thus exhibit high light and temperature stability. The sensitive mirror layer is also suitably protected by the encapsulation.

Figure 2:
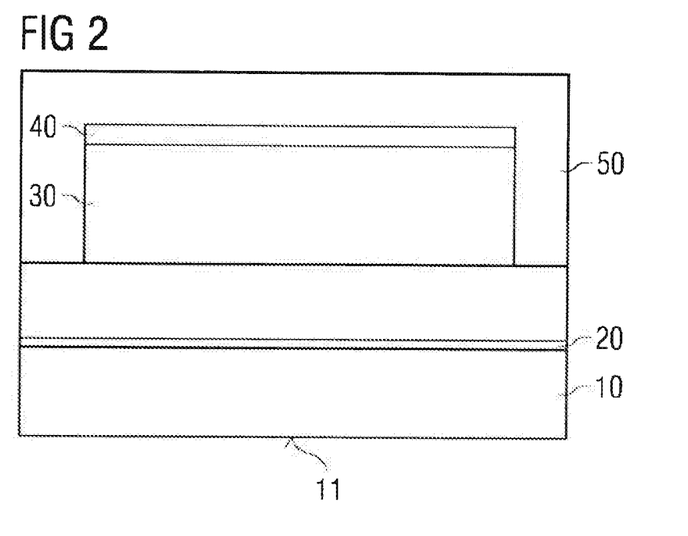
FIG. 2 shows a schematic cross-section of a radiation-emitting device according to another example.

FIG. 2 shows a schematic cross-section of another example of a radiation-emitting device. In contrast to the example shown in FIG. 1, the wavelength conversion layer 30 in this example contains an electrically conductive matrix material that makes it possible to dispense with a current expansion layer 60. This means that the radiation-emitting device can be manufactured even more compactly and cost-effectively.

Figure 3:
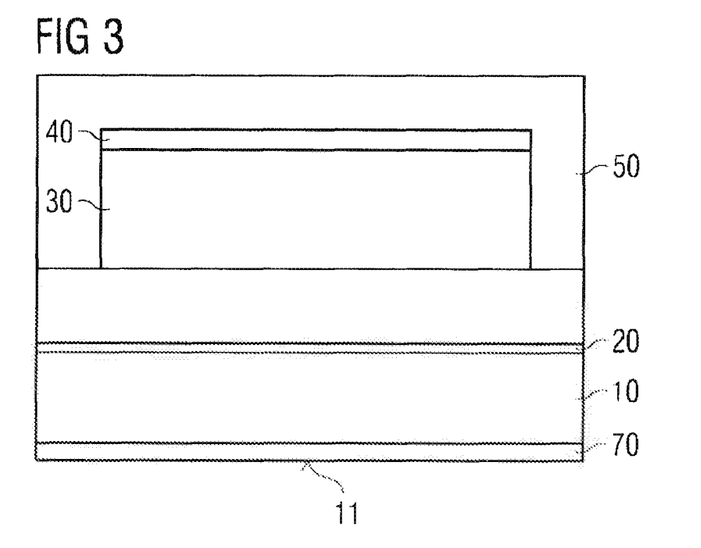
FIG. 3 shows a schematic cross-section of a radiation-emitting device according to another example.

FIG. 3 shows another example of a radiation-emitting device. In contrast to the example in FIG. 2, the radiation-emitting device also contains a dielectric mirror layer 70 between the decoupling surface 11 and the semiconductor layer sequence 10. The dielectric mirror 70 is suitable for reflecting blue light or at least partially reflecting it and transmitting only converted light, i.e., secondary radiation. Thus, the degree of conversion can be further increased and a full conversion made possible. Such a dielectric mirror 70 can, for example, be composed of inorganic layer sequences containing $Al_2O_3$, NbO, and $SiO_2$, respectively. The individual layers of the dielectric mirror layer 70 have exact layer thicknesses. Five to 30 such partial layers can be stacked on top of each other to form the dielectric mirror 70. Within the individual sublayers, the refractive index changes, enabling the reflection of blue light and the transmission of converted light.

Figure 4:
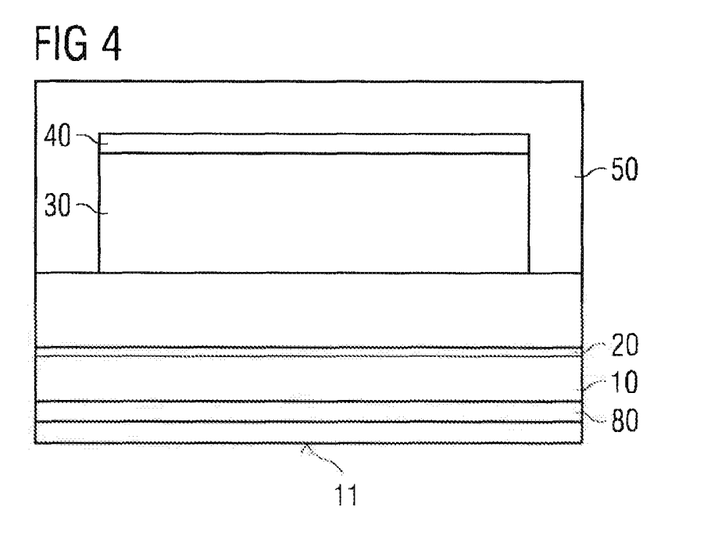
FIG. 4 shows a schematic cross-section of a radiation-emitting device according to another example.

FIG. 4 shows another example in a schematic section of a radiation-emitting device. In contrast to the example in FIG. 2, this radiation-emitting device contains an absorbing layer 80 arranged within the semiconductor layer sequence 10. Alternatively (not shown) such an absorbing layer can also be deposited on the surface facing away from the wavelength conversion layer 30. With such an absorbing layer 80, either full conversion or a specific color location of the emitted mixed light can be achieved. As material such an absorbing layer can contain epi material with high bandgap, especially GaN or GaInN, which can be mixed with Al as required.

Figure 5:
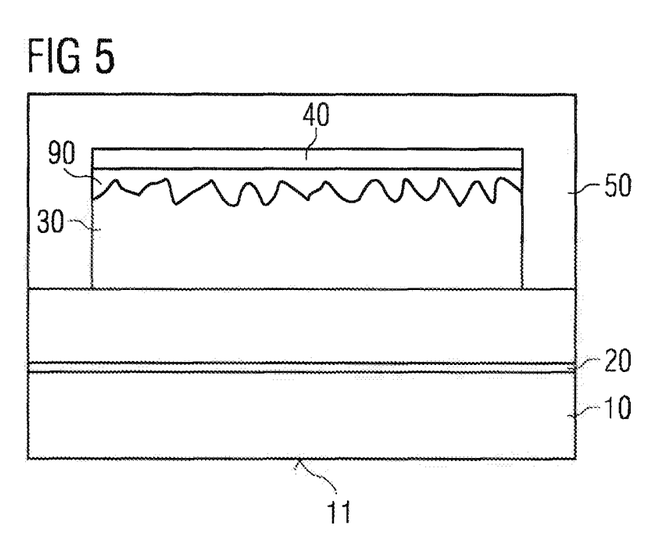
FIG. 5 shows a schematic cross-section of a radiation-emitting device according to another example.

FIG. 5 shows another example in a schematic cross-section of a radiation-emitting device. In contrast to the device shown in FIG. 2, the wavelength conversion layer 30 has a roughened surface. Between the wavelength conversion layer 30 and the mirror layer 40 there is a planarization layer 90 that planarizes the roughening on the surface of the wavelength conversion layer 30. The planarization layer 90 can contain or consist of $SiO_2$, for example. Such a roughening leads to an improved decoupling from the wavelength conversion layer, thus to a higher reflection at the mirror layer 40 and thus to a higher conversion probability in the wavelength conversion layer 30. In such an example, a roughening at the decoupling surface 11 can be dispensed with. The decoupling on the rear side of the semiconductor layer sequence 10, i.e., on the side of the wavelength conversion layer 30 facing away from the semiconductor layer sequence 10, has the advantage that more primary radiation, i.e., blue light, is directed to the conversion material. This increases the degree of conversion.

The examples shown in FIGS. 1 to 5 can also be combined in any way. A roughened surface of the wavelength conversion layer 30 can be combined with a dielectric mirror layer 70 and/or an absorbing layer 80. In the examples shown in FIGS. 2 to 5, there may also be an additional current expansion layer 60 between the semiconductor layer sequence 10 and the wavelength conversion layer 30.

In addition, an absorbing material that absorbs wavelengths in the blue spectral range may be present in the wavelength conversion layer 30 as an additional material or as a matrix material in the examples shown in FIGS. 1 to 5. The excitation of this material can be transferred to the conversion material and thus increase emission of secondary radiation. Such an absorbing material can also be chemically bound to the conversion material. For example, polymers can be used that have a blue emitting backbone (in this example an absorption in UV) equipped with red and/or green emitting side groups. The excitons are generated in the backbone, the emission can then be adjusted to the desired color via the number of side groups. Such polymers can be excited not only electrically, but also optically.

A radiation-emitting device such as the one exemplarily shown in FIGS. 1 to 5 is produced in a simplified manner. This is mainly due to the fact that the wavelength conversion layer 30 is applied close to the chip and at a wafer level. Due to the processing during the chip run, some otherwise necessary subsequent processes are dispensed with. To produce the wavelength conversion layer 30, the conversion material and, if necessary, a matrix material are applied at a wafer level on the semiconductor layer sequence 10 or on a current expansion layer 60 applied to it. In particular, matrix material and conversion material can be co-evaporated if an inorganic matrix material such as metal oxides or metal halides is used. When polymeric matrix materials are used, the conversion material can be dissolved in them, eventually with the aid of an additional solvent, and applied by spin coating or spraying. Furthermore, methods such as dip coating or the production of Langmuir-Blodgett films can be used to apply the wavelength conversion layer 30.

By adjusting the refractive index by suitable selection of a matrix material, the layer thickness of the wavelength conversion layer 30 and the concentration of the conversion material in the wavelength conversion layer 30, the decoupling into the wavelength conversion layer 30 and thus the degree of conversion can be controlled. This ultimately allows the color of the secondary radiation and thus also the color of the mixed light emitted by the radiation-emitting device to be influenced.

Our devices are not limited by the description based on the examples. Rather, this disclosure includes each new feature and each combination of features that in particular includes each combination of features in the appended claims, even if the feature or combination itself is not explicitly stated in the claims or examples.

This application claims priority of DE 10 2017 101 729.1, the subject matter of which is incorporated herein by reference.

The invention claimed is:

1. A radiation-emitting device comprising:
a semiconductor layer sequence having an active layer that emits a primary radiation during operation,
a decoupling surface on a surface of said semiconductor layer sequence,
a wavelength conversion layer on a side of the semiconductor layer sequence facing away from the decoupling surface, containing at least one conversion material that converts the primary radiation into secondary radiation, and
a mirror layer on the side of the wavelength conversion layer facing away from the semiconductor layer sequence, wherein
the at least one conversion material is electrically conductive and/or embedded in an electrically conductive matrix material,
wherein mixed light of unconverted primary and converted secondary radiation is emitted at the decoupling surface.

2. The radiation-emitting device according to claim 1, wherein the electrically conductive matrix material is selected from the group consisting of doped and undoped metal oxides, doped and undoped metal halides, electrically conductive polymers, polymers charged with electrically conductive particles, and polymers charged with electrically conductive salts.

3. The radiation-emitting device according to claim 1, wherein the refractive index of the electrically conductive matrix material is variable.

4. The radiation-emitting device according to claim 1, wherein the wavelength conversion layer has a thickness of less than or equal to 30 µm.

5. The radiation-emitting device according to claim 1, wherein the at least one conversion material is nanodisperse.

6. The radiation-emitting device according to claim 1, wherein the at least one conversion material in the wavelength conversion layer has a concentration of less than or equal to 100 mol %.

7. The radiation-emitting device according to claim 6, wherein the at least one conversion material in the wavelength conversion layer has a concentration of equal to or more than 0.01 mol %.

8. The radiation-emitting device according to claim 1, wherein the at least one conversion material is selected from the group consisting of quantum dots, quantum dots enclosed in an inorganic matrix, organometallic frameworks and organometallic complexes.

9. The radiation-emitting device according to claim 1, wherein the wavelength conversion layer comprises an absorbent material that absorbs wavelengths in the blue spectral region.

10. The radiation-emitting device according to claim 9, wherein the absorbent material is chemically bonded to a conversion material.

11. The radiation-emitting device according to claim 1, wherein the wavelength conversion layer has a roughened surface on the side facing away from the semiconductor layer sequence.

12. The radiation-emitting device according to claim 11, further comprising a planarization layer between the roughened surface and the mirror layer.

13. The radiation-emitting device according to claim 12, wherein the planarization layer contains or consists of $SiO_2$.

14. The radiation-emitting device according to claim 1, further comprising an encapsulation surrounding at least the wavelength conversion layer and the mirror layer.

15. The radiation-emitting device according to claim 14, wherein the encapsulation comprises metallic or dielectric material.

16. The radiation-emitting device according to claim 1, the encapsulation having a thickness less than or equal to 1 µm.

17. The radiation-emitting device according to claim 14, wherein the encapsulation has a thickness of 50 nm to 500 nm.

18. The radiation-emitting device according to claim 1, wherein the mirror layer comprises a metal layer.

19. A radiation-emitting device comprising:
a semiconductor layer sequence having an active layer that emits a primary radiation during operation,
a decoupling surface on a surface of said semiconductor layer sequence, a wavelength conversion layer on a side of the semiconductor layer sequence facing away from the decoupling surface, containing at least one conversion material that converts the primary radiation into secondary radiation, a mirror layer on the side of the wavelength conversion layer facing away from the semiconductor layer sequence, wherein the at least one conversion material is electrically conductive and/or embedded in an electrically conductive matrix material, the wavelength conversion layer has a roughened surface on the side facing away from the semiconductor layer sequence, and wherein mixed light of unconverted primary and converted secondary radiation is emitted at the decoupling surface.

\* \* \* \* \*